(12) United States Patent
Park et al.

(10) Patent No.: US 9,076,721 B2
(45) Date of Patent: Jul. 7, 2015

(54) OXYNITRIDE CHANNEL LAYER, TRANSISTOR INCLUDING THE SAME AND METHOD OF MANUFACTURING THE SAME

(71) Applicant: Samsung Electronics Co., Ltd., Suwon-Si, Gyeonggi-Do (KR)

(72) Inventors: Joon-seok Park, Seongnam-si (KR); Sun-jae Kim, Seoul (KR); Tae-sang Kim, Seoul (KR); Hyun-suk Kim, Hwaseong-si (KR); Myung-kwan Ryu, Yongin-si (KR); Seok-jun Seo, Anyang-si (KR); Jong-baek Seon, Yongin-si (KR); Kyoung-seok Son, Seoul (KR); Sang-yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/770,007

(22) Filed: Feb. 19, 2013

(65) Prior Publication Data
US 2014/0001464 A1    Jan. 2, 2014

(30) Foreign Application Priority Data
Jun. 29, 2012    (KR) .................. 10-2012-0071373

(51) Int. Cl.
    *H01L 23/48*    (2006.01)
    *H01L 23/52*    (2006.01)
    *H01L 29/40*    (2006.01)
    *H01L 29/24*    (2006.01)
    *H01L 29/66*    (2006.01)
    *H01L 29/786*    (2006.01)

(52) U.S. Cl.
    CPC .......... *H01L 29/24* (2013.01); *H01L 29/66742* (2013.01); *H01L 29/7869* (2013.01); *H01L 29/66969* (2013.01)

(58) Field of Classification Search
    USPC ......... 257/760, 761, 649, 359, 607, 613, 614, 257/615, E21.006, E21.007, E21.051, 257/E21.129, E21.135, E21.17, E21.227, 257/E21.267, E21.315, E21.4, E21.411, 257/21.135
See application file for complete search history.

(56) References Cited

U.S. PATENT DOCUMENTS 7,180,143 B2 *  2/2007  Kanegae et al. ............. 257/410
7,851,296 B2 *  12/2010  Noda et al. .................. 438/216
7,955,950 B2 *  6/2011  Lee et al. ..................... 438/458
8,294,148 B2 *  10/2012  Ye ................................. 257/43

(Continued)

FOREIGN PATENT DOCUMENTS

KR    2010-0010978 A    2/2010
KR    2011-0028386 A    3/2011
KR    2011-0030694 A    3/2011

OTHER PUBLICATIONS

Ye, Y. et al. "High Mobility Amorphous Zinc Oxynitride Semiconductor Material for Thin Film Transistors." Journal of Applied Physics (2009) vol. 106, 074512: 1-8; American Institute of Physics.

*Primary Examiner* — David Nhu
(74) *Attorney, Agent, or Firm* — Harness, Dickey & Pierce, P.L.C.

(57) ABSTRACT

A transistor includes a channel layer including an oxynitride semiconductor doped with at least one of hafnium (Hf) and zirconium (Zr), a source on one side portion of the channel layer and a drain on another side portion of the channel layer, a gate corresponding to the channel layer, and a gate insulation layer between the channel layer and the gate.

17 Claims, 6 Drawing Sheets

(56) References Cited

U.S. PATENT DOCUMENTS

| | | | |
|---|---|---|---|
| 8,314,421 B2* | 11/2012 | Qiu et al. | 257/43 |
| 8,350,313 B2* | 1/2013 | Noda et al. | 257/315 |
| 8,728,883 B2* | 5/2014 | Yamazaki et al. | 438/162 |
| 2009/0050884 A1 | 2/2009 | Ye | |
| 2010/0301343 A1 | 12/2010 | Qiu et al. | |
| 2011/0175084 A1 | 7/2011 | Ye | |
| 2011/0266537 A1 | 11/2011 | Ye | |
| 2011/0278567 A1 | 11/2011 | Ye | |
| 2011/0306169 A1 | 12/2011 | Ye | |
| 2012/0000773 A1 | 1/2012 | Ye et al. | |

\* cited by examiner

OXYNITRIDE CHANNEL LAYER, TRANSISTOR INCLUDING THE SAME AND METHOD OF MANUFACTURING THE SAME

CROSS-REFERENCE TO RELATED APPLICATIONS

This application claims the benefit of Korean Patent Application No. 10-2012-0071373, filed on Jun. 29, 2012, in the Korean Intellectual Property Office, the disclosure of which is incorporated herein in its entirety by reference.

BACKGROUND

1. Field

Example embodiments relate to an oxynitride channel layer, a transistor including the same and a method of manufacturing the same.

2. Description of the Related Art

Transistors are widely used as switching devices or driving devices in an electronic device field. Specifically, because thin film transistors (TFTs) may be manufactured on a glass substrate or plastic substrate, the TFTs are usefully used in a field of display devices, e.g., liquid crystal display devices or organic light emitting display devices.

In order to improve operation characteristics of the transistor, applying of an oxide semiconductor having relatively high carrier mobility to a channel layer has been attempted. An oxide semiconductor device has characteristics of both an amorphous silicon TFT and a poly-silicon TFT. A zinc (Zn) oxide-based TFT has recently been introduced as the oxide semiconductor device. Examples of a Zn oxide-based material include Zn oxide, indium (In)—Zn oxide, and Ga-, Mg-, Al-, or Fe-doped Zn or In—Zn oxide. Because a zinc oxide (ZnO)-based semiconductor device is manufactured at a relatively low temperature and is in an amorphous state, the ZnO-based semiconductor device may have a relatively large size. Also, a Zn oxide-based semiconductor film is formed of a relatively high mobility material, and has a desirable electrical characteristic like polycrystalline silicon. Currently, studies to use an oxide semiconductor material layer having relatively high mobility, e.g., a Zn oxide-based material layer in a channel region of a TFT, are being performed. A zinc oxynitride (ZnON) channel layer, e.g., a ZnO-based channel layer including nitrogen, is known to have relatively high mobility.

SUMMARY

Example embodiments provide a channel layer, a transistor including the same and having improved mobility and reliability, and a method of manufacturing the same. Additional aspects will be set forth in part in the description which follows and, in part, will be apparent from the description, or may be learned by practice of example embodiments.

According to example embodiments, a channel layer may include an oxynitride semiconductor doped with at least one of hafnium (Hf) and zirconium (Zr).

The oxynitride semiconductor may include zinc oxynitride (ZnON). Hf may be doped on the channel layer, and a value of Hf/(Hf+Zn) may be lower than or equal to about 2%. Zr may be doped on the channel layer, and a value of Zr/(Zr+Zn) may be lower than or equal to about 2%. A value of O/(O+N) in the channel layer may be from about 10% to about 90%. A thickness of the channel layer may be in the range from about 5 to about 100 nm.

According to example embodiments, a transistor includes the channel layer, a source on one side portion of the channel layer and a drain on another side portion of the channel layer, a gate corresponding to the channel layer, and a gate insulation layer between the channel layer and the gate.

The oxynitride semiconductor may include zinc oxynitride (ZnON). Hf may be doped on the channel layer, and a value of Hf/(Hf+Zn) may be lower than or equal to about 2%. Zr may be doped on the channel layer, and a value of Zr/(Zr+Zn) may be lower than or equal to about 2%. A value of O/(O+N) in the channel layer may be from about 10% to about 90%.

A thickness of the channel layer may be in the range from about 5 to about 100 nm. The gate may be formed on a substrate and the channel layer may be formed on the gate insulation layer. The channel layer may be formed on a substrate and the gate may be formed on the gate insulation layer. The transistor may further include an etch stop layer on the channel layer.

According to example embodiments, an electronic device includes the transistor.

According to example embodiments, a display device includes a display cell, and the transistor configured to control driving of the display cell according to image information.

According to example embodiments, a method of forming a channel layer may include doping an oxynitride semiconductor with at least one of hafnium (Hf) and zirconium (Zr).

Doping the oxynitride semiconductor may include doping a zinc oxynitride (ZnON) semiconductor. Doping the ZnON semiconductor may include performing a reactive cosputtering method using a Zn metal target and one of a hafnium oxide ($HfO_2$) ceramic target and a $ZrO_2$ ceramic target. Doping the ZnON semiconductor may include a reactive sputtering method using one of a Hf—Zn metal alloy target and a Zr—Zn metal alloy target. The ZnON semiconductor may be doped with Hf such that a value of Hf/(Hf+Zn) is lower than or equal to about 2%. The ZnON semiconductor may be doped with Zr such that a value of Zr (Zr+Zn) is lower than or equal to about 2%. The ZnON semiconductor may be doped such that a value of O/(O+N) is from about 10% to about 90%.

According to example embodiments, a method of manufacturing a transistor may include forming the channel layer, forming a source contacting one side portion of the channel layer and a drain contacting another side portion of the channel layer, forming a gate corresponding to the channel layer, and forming a gate insulation layer between the channel layer and the gate.

The oxynitride semiconductor may be zinc oxynitride (ZnON). Forming the channel layer may include a reactive cosputtering method using a Zn metal target and hafnium oxide ($HfO_2$) ceramic target or $ZrO_2$ ceramic target. Forming the channel layer may include a reactive sputtering method using a Hf—Zn metal alloy target or a Zr—Zn metal alloy target.

Argon (Ar), $O_2$, or $N_2$ may be used as a reaction gas. The Ar gas may be supplied at a flow rate of about 1 to about 50 sccm, the $O_2$ gas may be supplied at a flow rate of about 1 to about 15 sccm, and the $N_2$ gas may be supplied at a flow rate of about 20 to about 200 sccm.

The channel layer may be formed such that a value of Hf/(Hf+Zn) is lower than or equal to about 2%. The channel layer may be formed such that a value of Zr (Zr+Zn) is lower than or equal to about 2%. The channel layer may be formed such that a value of O/(O+N) is from about 10% to about 90%.

The channel layer may be formed on the gate insulation layer. The gate may be formed on the gate insulation layer. The method may further include forming an etch stop layer on the channel layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
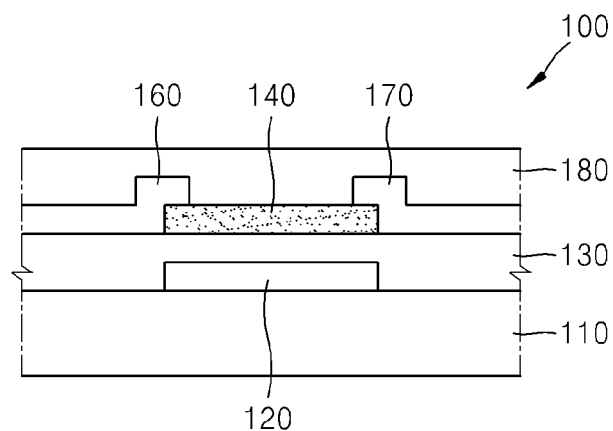
FIG. 1 is a cross-sectional view of a schematic structure of a transistor according to example embodiments.

Hereinafter, a transistor and a method of manufacturing the same according to example embodiments will now be described in detail with reference to the accompanying drawings, wherein like reference numerals refer to like elements throughout and sizes of elements may be exaggerated for clarity. Also, the embodiments described below are merely examples, and various modifications are possible from the embodiments. It will be understood that when an element is referred to as being "above" or "on" another element, it may be directly on the other element or intervening elements may also be present. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIG. 1 is a cross-sectional view of a schematic structure of a transistor 100 according to example embodiments. The transistor 100 according to example embodiments suggests a structure wherein a hafnium (Hf)-doped oxynitride semiconductor is applied to a channel layer 140 so as to obtain mobility performance and reliability. The transistor 100 includes the channel layer 140 including the Hf-doped oxynitride semiconductor, a source 160 and a drain 170 respectively formed on two side portions of the channel layer 140, a gate 120 corresponding to the channel layer 140, and a gate insulation layer 130 formed between the channel layer 140 and the gate 120.

A detailed structure and material of the transistor 100 will now be described in detail. Any one of various substrates, e.g., a plastic substrate and a silicon substrate, used in a general semiconductor process, or a glass substrate may be used as a substrate 110.

The gate 120 may be formed on the substrate 110. The gate 120 may be formed of a general electrode material, e.g., metal or conductive oxide. For example, the gate 120 may be formed of metal, e.g., titanium (Ti), platinum (Pt), ruthenium (Ru), gold (Au), silver (Ag), molybdenum (Mo), aluminum (Al), tungsten (W), or copper (Cu), or conductive oxide, e.g., indium zinc oxide (IZO), indium tin oxide (ITO), or aluminum zinc oxide (AZO).

The gate insulation layer 130 covering the gate 120 may be formed on the substrate 110. The gate insulation layer 130 may be formed of silicon oxide, silicon oxynitride, or silicon nitride, or another material, e.g., a high dielectric material having a higher dielectric constant than silicon nitride. Alternatively, the gate insulation layer 130 may have a structure wherein at least two layers of a silicon oxide layer, a silicon oxynitride layer, a silicon nitride layer, and a high dielectric material layer are stacked on each other.

The channel layer 140 may be formed on the gate insulation layer 130. The channel layer 140 may include an oxynitride semiconductor doped with at least one of Hf and zirconium (Zr). For example, the channel layer 140 may be formed by doping Hf on a ZnON-based semiconductor, and may be in an amorphous state or nanocrystalline state. The channel layer 140 may have a cation ratio, e.g., a value of Hf/(Hf+Zn)

lower than or equal to about 2%, for example, lower than or equal to about 0.7%. An anion ratio, e.g., a value of O/(O+N), may be from about 10% to about 90%. A thickness of the channel layer 140 may be from about 5 to about 100 nm. The expression Hf/(Hf+Zn) denotes a ratio of an Hf amount with respect to a total amount of Hf and Zn.

The source and drain 160 and 170 are respectively formed on two side portions of the channel layer 140. The source and drain 160 and 170 may be formed of metal or conductive oxide. For example, the source and drain 160 and 170 may be formed of metal, e.g., Ti, Pt, Ru, Au, Ag, Mo, Al, W, or Cu, or conductive oxide, e.g., IZO, ITO, or AZO.

A passivation layer 180 may be formed on the gate insulation layer 130 while covering the source 160, the drain 170, and the channel layer 140. The passivation layer 180 may be a silicon oxide layer, a silicon oxynitride layer, a silicon nitride layer, or an organic insulation layer, or have a structure wherein at least two thereof are stacked on each other.

In the case of the transistor 100, the Hf-doped oxynitride semiconductor is applied to the channel layer 140 to improve mobility performance and reliability.

Figure 2:
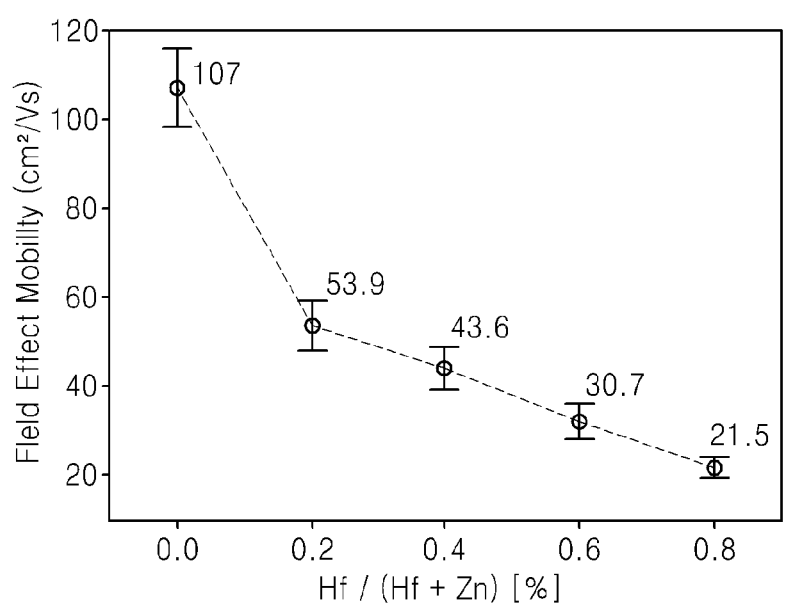
FIG. 2 is a graph showing field effect mobility according to hafnium (Hf) concentration in the transistor of FIG. 1.

FIG. 2 is a graph showing field effect mobility according to Hf concentration in the transistor 100 of FIG. 1.

The graph of FIG. 2 shows field effect mobility according to a cation ratio Hf/(Hf+Zn) when Hf is doped on ZnON. The field effect mobility decreases as the Hf concentration is increased, but there is a section where the field effect mobility is equal to or higher than 30 cm$^2$/Vs. An improved field effect mobility performance equal to or higher than about 30 cm$^2$/Vs is shown when a value of Hf/(Hf+Zn) is about 0.7% or less.

Figure 3:
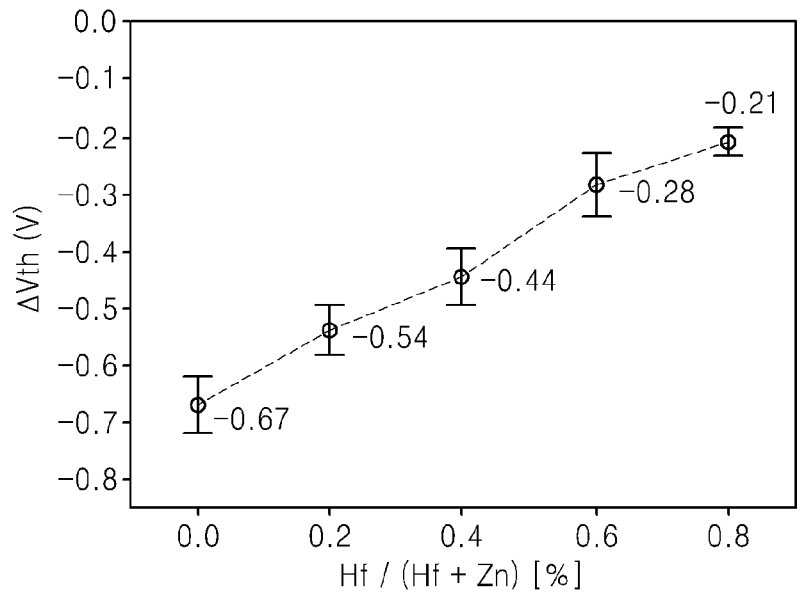
FIG. 3 is a graph showing a negative bias temperature stress (NBTS) reliability trend according to Hf concentration in the transistor of FIG. 1.

FIG. 3 is a graph showing a negative bias temperature stress (NBTS) reliability trend according to Hf concentration in the transistor 100 of FIG. 1.

The graph of FIG. 3 shows a change of threshold voltage $\Delta V_{th}$ according to a cation ratio Hf/(Hf+Zn) when a channel layer is formed while Hf is doped on ZnOn. According to NBTS conditions, a gate voltage Vg is about −20 V, a temperature is about 60° C. and a time is about 1.5 hour. Referring to FIG. 3, the change of threshold voltage $\Delta V_{th}$ decreases as the Hf concentration is increased.

Figure 4:
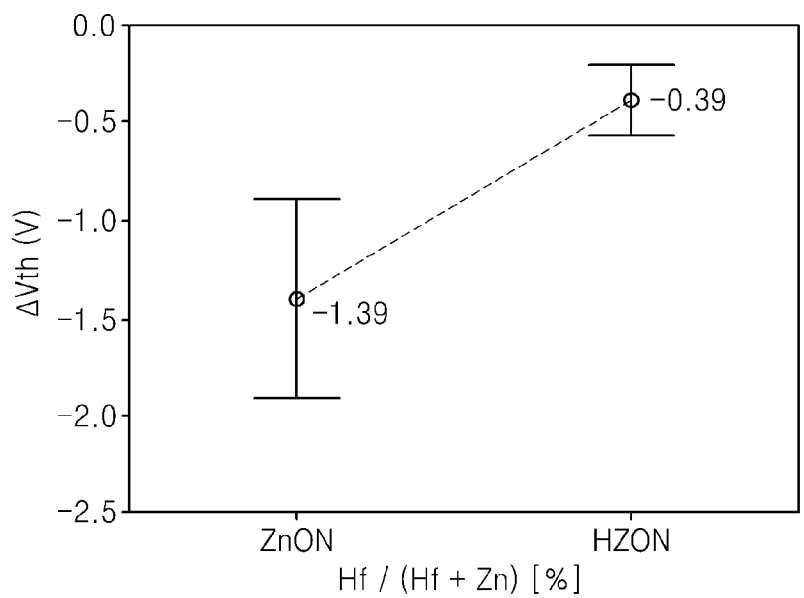
FIG. 4 is a graph showing negative bias illumination temperature stress (NBITS) reliability trends of the transistor of FIG. 1 and a transistor of Comparative Example.

FIG. 4 is a graph showing negative bias illumination temperature stress (NBITS) reliability trends of the transistor 100 of FIG. 1 and a transistor of Comparative Example.

The graph of FIG. 4 shows changes of threshold voltages $\Delta V_{th}$ in example embodiments in that a channel layer includes Hf doped ZnON and a Comparative Example in that a channel layer is formed of ZnON on which Hf is not doped.

NBITS conditions are such that a lighting condition of using a blue light emitting diode (LED) is further added to the NBTS conditions. In other words, the NBITS conditions are used to test electro-optical reliability considering that performance of a channel layer may be deteriorated as light from a backlight is incident on the channel layer in a liquid crystal display device including the backlight as an image forming light source when a transistor is employed as a driving unit of the liquid crystal display device. Referring to FIG. 4, example embodiments where Hf is doped has a smaller change $\Delta V_{th}$ than the Comparative Example where Hf is not doped.

Referring to FIGS. 2 through 4, desirable mobility is maintained and electric reliability and electro-optical reliability are improved by doping Hf on an oxynitride semiconductor and suitably determining Hf concentration.

Reliability is improved by doping Hf on an oxynitride semiconductor, e.g., ZnOn, because Hf shows a stronger bond than Zn when combined with oxygen or nitrogen. A transistor using a ZnON semiconductor deteriorates due to oxygen vacancy or nitrogen vacancy operating as a carrier trap, and concentration of oxygen vacancy and nitrogen vacancy may be reduced by doping Hf on ZnON, thereby improving reliability of the transistor. A doping element that brings a similar effect is zirconium (Zr) in the same group as Hf in the periodic table, and thus Zr may be doped on an oxynitride semiconductor to form the channel layer 140. Also, in example embodiments, a value of Zr/(Zr+Zn) may be lower than or equal to about 2%.

Figure 5:
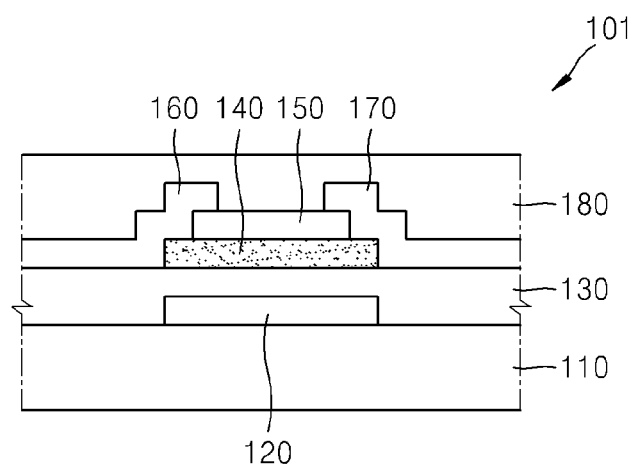
FIG. 5 is a cross-sectional view showing a schematic structure of a transistor according to example embodiments.

FIG. 5 is a cross-sectional view showing a schematic structure of a transistor 101 according to example embodiments. The transistor 101 is different from the transistor 100 of FIG. 1 in that an etch stop layer 150 is further disposed on the channel layer 140.

The etch stop layer 150 may be used to prevent or inhibit the channel layer 140 from being damaged due to etching while forming the source 160 and the drain 170 contacting two sides of the channel layer 140. The etch stop layer 150 may be formed of silicon oxide (SiOx), silicon nitride (SiNx), aluminum oxide (AlxOx), silicon oxynitride (SiON), fluorinated silicon oxide (SiOF), or silicon oxycarbide (SiOC), but is not limited thereto. The etch stop layer 150 may have a single layer structure or a multilayer structure. For example, because the etch stop layer 150 formed by using a low temperature plasma enhanced chemical vapor deposition (PECVD) process is porous, an etchant may penetrate through the etch stop layer 150, thereby damaging the channel layer 140. Meanwhile, when the etch stop layer 150 is formed directly on the channel layer 140 by using a high temperature PECVD process so as to form the etch stop layer 150 that is structurally dense, the channel layer 140 may be damaged due to a relatively high temperature. Accordingly, the channel layer 140 may be protected by forming etch stop layer 150 including two layers according to two operations at high and low temperatures.

Figure 6:
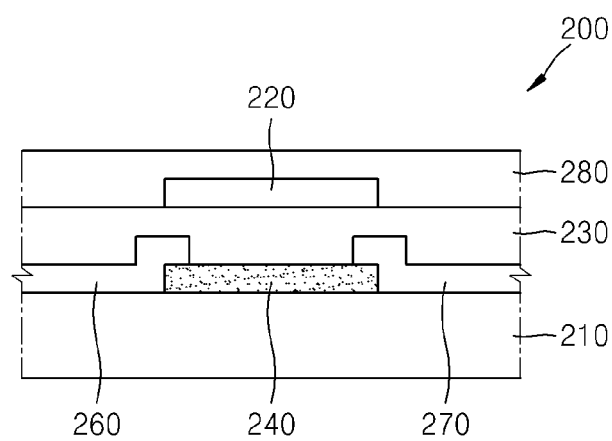
FIG. 6 is a cross-sectional view showing a schematic structure of a transistor according to example embodiments.

FIG. 6 is a cross-sectional view showing a schematic structure of a transistor 200 according to example embodiments. The transistors 100 and 101 of FIGS. 1 and 4 are bottom gate types wherein the gate 120 is disposed at the bottom whereas the transistor 200 of FIG. 6 is a top gate type wherein a gate 220 is disposed at the top.

Referring to FIG. 6, a channel layer 240 is formed on a substrate 210, a gate insulation layer 230 is formed to cover the channel layer 240, a source 260, and a drain 270, and the gate 220 and a passivation layer 280 covering the gate 220 are formed on the gate insulation layer 230. The channel layer 240 is formed by doping Hf or Zr on an oxynitride semiconductor, for example, ZnON, and is substantially identical to the channel layer 140 described above. Also, the source 260, the drain 270, the gate 220, the gate insulation layer 230, and the passivation layer 280 may respectively have substantially identical structures as the source 160, the drain 170, the gate 120, the gate insulation layer 130, and the passivation layer 180 of FIG. 1.

Figure 7:
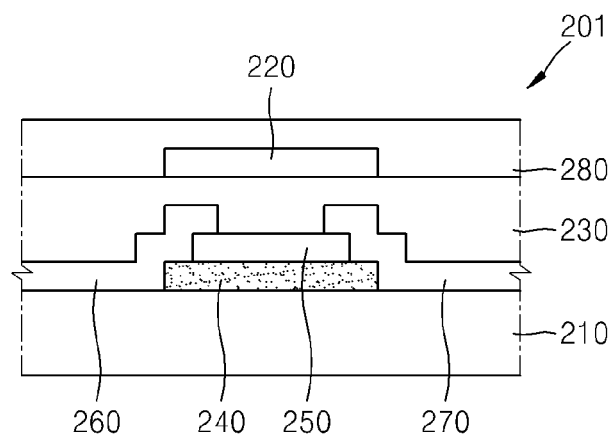
FIG. 7 is a cross-sectional view showing a schematic structure of a transistor according to example embodiments.

FIG. 7 is a cross-sectional view showing a schematic structure of a transistor 201 according to example embodiments. Like FIG. 6, the transistor 201 is a top gate type, but the transistor 201 is different from the transistor 200 of FIG. 6 as an etch stop layer 250 is further disposed on the channel layer 240. The etch stop layer 250 may have substantially the same structure as the etch stop layer 150 of FIG. 5.

The transistors 100, 101, 200, and 201 have relatively high mobility and reliability by doping at least one of Hf and Zr on an oxynitride semiconductor. The transistors 100, 101, 200, and 201 may each be employed as a driving device or a switching device in one of various electronic devices. For example, the transistors 100, 101, 200, and 201 may each be employed in a display device, as a driving device controlling driving of a display cell according to image information, wherein high speed driving and high resolution display is possible. The display device may be one of various types of flat-panel display devices, e.g., an active matrix liquid crystal display (AMLCD) and active matrix organic light emitting diode (AMOLED).

FIGS. 8A through 8F are cross-sectional views for describing a method of manufacturing a transistor, according to example embodiments. The method according to example embodiments largely includes forming a channel layer by using a Hf-containing oxynitride semiconductor, forming a source and drain contacting side portions of the channel layer, forming a gate corresponding to the channel layer, and forming a gate insulation layer between the channel layer and the gate, wherein FIGS. 8A through 8F show an example of such a method.

Figure 8A:
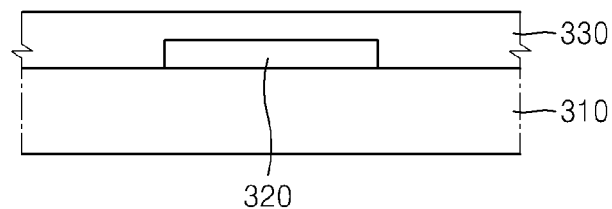
FIGS. 8A through 8F are cross-sectional views for describing a method of manufacturing a transistor, according to example embodiments.

Referring to FIG. 8A, a gate 320 and a gate insulation layer 330 covering the gate 320 are formed on a substrate 310. The substrate 310 may be any one of various substrates used in a general semiconductor device process, e.g., a plastic substrate, a silicon substrate, or a glass substrate. The gate 320 may be formed of a general electrode material, e.g., metal or conductive oxide. For example, the gate 320 may be formed of metal, e.g., Ti, Pt, Ru, Au, Ag, Mo, Al, W, or Cu, or a conductive material, e.g., IZO, ITO, or AZO. The gate insulation layer 330 may be formed of silicon oxide, silicon oxynitride, or silicon nitride, or another material, e.g., a high dielectric material having a higher dielectric constant than silicon nitride. Alternatively, the gate insulation layer 330 may have a structure in which at least two silicon oxide layers, a silicon oxynitride layer, a silicon nitride layer, and a high dielectric material layer are stacked on each other.

Figure 8B:
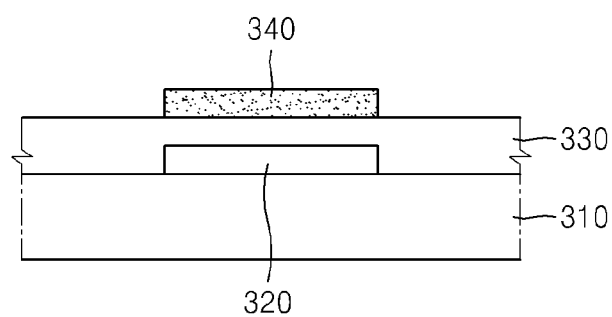

Referring to FIG. 8B, a channel layer 340 is formed on the gate insulation layer 330. The channel layer 340 may be formed by doping Hf or Zr on an oxynitride semiconductor, for example ZnON. The channel layer 340 may have a cation ratio, e.g. a value of Hf/(Hf+Zn), lower than or equal to about 2% or about 0.7%. Alternatively, a value of Zr/(Zr+Zn) may be lower than or equal to about 2%. Also, an anion ratio, e.g., a value of O/(O+N), may be from about 10% to about 90%. A thickness of the channel layer 340 may be from about 5 to about 100 nm. The channel layer 340 may be formed by using a reactive cosputtering method using a Zn metal target and a $HfO_2$ or $ZrO_2$ ceramic target. Alternatively, a reactive sputtering method using a Hf—Zn metal alloy target or a Zr—Zn metal alloy target may be used. Here, Ar, $O_2$, or $N_2$ may be used as a reaction gas, wherein an Ar gas is supplied at a flow rate from about 1 to about 50 sccm, an $O_2$ gas is supplied at a flow rate from about 1 to about 15 sccm, and a $N_2$ gas is supplied at a flow rate from about 20 to about 200 sccm. Instead of forming the channel layer 340 by using a reactive sputtering method, the channel layer 340 may be formed by using another method, e.g., a metal organic chemical vapor deposition (MOCVD) method, a chemical vapor deposition (CVD) method, an atomic layer deposition (ALD) method, or an evaporation method. A thermal process may be further performed on the channel layer 340. The thermal process may be performed at a temperature from about 150 to about 350° C. under a $N_2$, $O_2$, or air atmosphere.

Figure 8C:
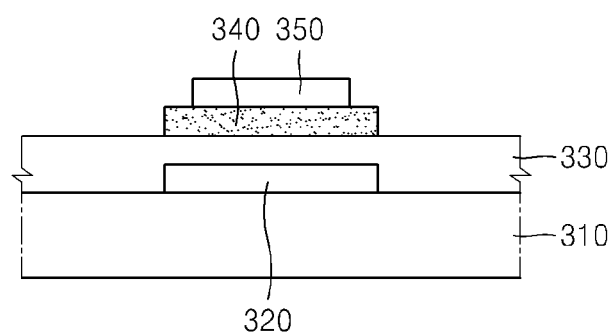

Referring to FIG. 8C, an etch stop layer 350 may be formed on the channel layer 340. The etch stop layer 350 may be used to prevent or inhibit the channel layer 340 from being damaged when a conductive material is formed on the channel layer 340 and etched to form a source and a drain. The etch stop layer 350 may be formed of SiOx, SiNx, AlxOx, SiON, SiOF, or SiOC, but is not limited thereto. The etch stop layer 350 may have a single layer structure or a plurality of layers to effectively protect the channel layer 340, for example, two layers respectively formed via a low temperature PECVD process and a high temperature PECVD process. A width of the etch stop layer 350 may be narrower than that of the channel layer 340 such that the source and the drain to be formed later satisfactorily contact the channel layer 340.

Figure 8D:
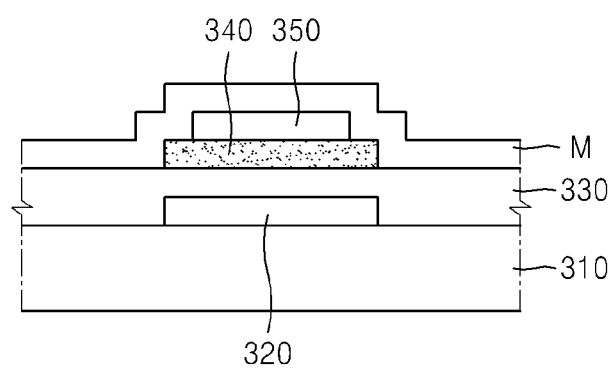

Referring to FIG. 8D, a conductive material layer M covering the channel layer 340 and the etch stop layer 350 may be formed on the gate insulation layer 330. The conductive material layer M may be formed of a general electrode material, e.g., metal or conductive oxide. For example, the conductive material layer M may be formed of metal, e.g., Ti, Pt, Ru, Au, Ag, Mo, Al, W, or Cu, or a conductive oxide, e.g., IZO, ITO, or AZO.

Figure 8E:
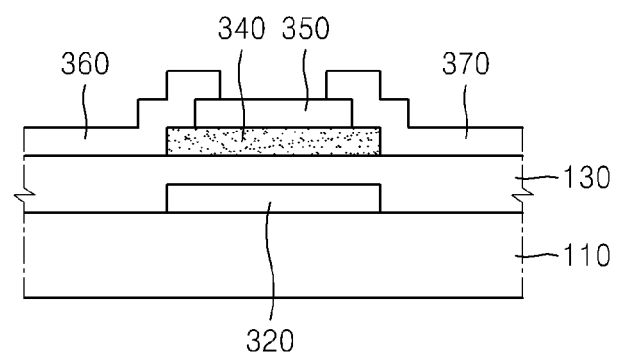
Figure 8F:
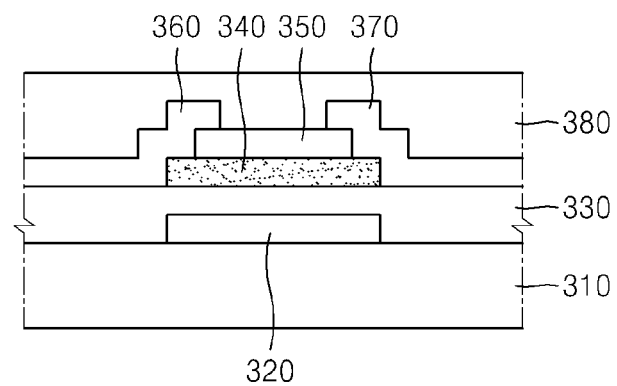

Referring to FIG. 8E, the conductive material layer M formed on the etch stop layer 350 is etched to form a source 360 and a drain 370. A passivation layer 380 may be further formed as shown in FIG. 8F.

A following thermal process (annealing process) may be further performed on a transistor manufactured as such. The thermal process may be performed at a temperature from about 150 to about 350° C. under a $N_2$, $O_2$, or air atmosphere.

A transistor manufactured according to the method described above has a bottom gate structure and includes an etch stop layer, but alternatively, the etch stop layer may not be formed, or a gate insulation layer may be formed on a channel layer and a gate may be disposed on the gate insulation layer.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A channel layer comprising an oxynitride semiconductor material with which impurities including at least one of hafnium (Hf) and zirconium (Zr) are doped.

2. The channel layer of claim 1, wherein the oxynitride semiconductor material includes zinc oxynitride (ZnON).

3. The channel layer of claim 2, wherein the channel layer is doped with Hf, and a value of Hf/(Hf+Zn) is lower than or equal to about 2%.

4. The channel layer of claim 2, wherein the channel layer is doped with Zr, and a value of Zr/(Zr+Zn) is lower than or equal to about 2%.

5. The channel layer of claim 2, wherein a value of O/(O+N) in the channel layer is from about 10% to about 90%.

6. The channel layer of claim 2, wherein a thickness of the channel layer is in the range from about 5 to about 100 nm.

7. A transistor comprising:
the channel layer of claim 1;
a source on one side portion of the channel layer and a drain on another side portion of the channel layer;
a gate corresponding to the channel layer; and
a gate insulation layer between the channel layer and the gate.

8. The transistor of claim 7, wherein the oxynitride semiconductor material includes zinc oxynitride (ZnON).

9. The transistor of claim 8, wherein the channel layer is doped with Hf, and a value of Hf/(Hf+Zn) is lower than or equal to about 2%.

10. The transistor of claim 8, wherein the channel layer is doped with Zr, and a value of Zr/(Zr+Zn) is lower than or equal to about 2%.

11. The transistor of claim 8, wherein a value of O/(O+N) in the channel layer is from about 10% to about 90%.

12. The transistor of claim 8, wherein a thickness of the channel layer is in the range from about 5 to about 100 nm.

13. The transistor of claim 7, wherein the gate is formed on a substrate and the channel layer is formed on the gate insulation layer.

14. The transistor of claim 7, wherein the channel layer is formed on a substrate and the gate is formed on the gate insulation layer.

15. The transistor of claim 7, further comprising:
an etch stop layer on the channel layer.

16. An electronic device comprising the transistor of claim 7.

17. A display device comprising:
a display cell; and
the transistor of claim 7, the transistor configured to control driving of the display cell according to image information.

* * * * *